United States Patent
Wang et al.

(10) Patent No.: US 10,433,451 B1
(45) Date of Patent: Oct. 1, 2019

(54) MOUNTING DEVICE

(71) Applicant: HONGFUJIN PRECISION ELECTRONICS (TIANJIN) CO., LTD., Tianjin (CN)

(72) Inventors: Nan-Chieh Wang, New Taipei (TW); Wen-Chen Wang, New Taipei (TW)

(73) Assignee: HONGFUJIN PRECISION ELECTRONICS(TIANJIN)CO., LTD., Tianjin (CN)

( * ) Notice: Subject to any disclaimer, the term of this patent is extended or adjusted under 35 U.S.C. 154(b) by 0 days.

(21) Appl. No.: 16/204,169

(22) Filed: Nov. 29, 2018

(30) Foreign Application Priority Data

Aug. 21, 2018 (CN) .......................... 2018 1 0953343

(51) Int. Cl.
*H05K 7/14* (2006.01)
*H05K 5/02* (2006.01)
*H05K 7/00* (2006.01)
*H05K 5/00* (2006.01)

(52) U.S. Cl.
CPC ......... *H05K 7/1421* (2013.01); *H05K 5/0073* (2013.01); *H05K 5/0217* (2013.01); *H05K 7/1411* (2013.01); *H05K 7/1417* (2013.01); *H05K 7/1427* (2013.01)

(58) Field of Classification Search
CPC .. H05K 7/1421; H05K 5/0217; H05K 7/1417; H05K 7/1427; H05K 5/0073; H05K 7/1411
USPC .......................................................... 361/727
See application file for complete search history.

(56) References Cited

U.S. PATENT DOCUMENTS

| | | | | |
|---|---|---|---|---|
| 6,067,225 | A * | 5/2000 | Reznikov | G11B 33/122 312/223.2 |
| 6,186,804 | B1 * | 2/2001 | Smith | G11B 33/10 439/157 |
| 6,288,902 | B1 * | 9/2001 | Kim | G11B 33/08 206/701 |
| 6,937,476 | B1 * | 8/2005 | Chen | G06F 1/184 361/732 |
| 8,369,080 | B2 * | 2/2013 | Huang | G06F 1/187 361/679.37 |
| 8,432,670 | B2 * | 4/2013 | Chen | G11B 33/124 361/679.02 |
| 2005/0155781 | A1 * | 7/2005 | Kao | H02G 3/20 174/50 |
| 2005/0174730 | A1 * | 8/2005 | Chen | H05K 7/1487 361/679.35 |

(Continued)

*Primary Examiner* — Rockshana D Chowdhury
(74) *Attorney, Agent, or Firm* — ScienBiziP, P.C.

(57) ABSTRACT

A mounting device includes a mounting box, a tray, and a sliding mechanism. The mounting box includes a bottom plate. The sliding mechanism includes a handle and at least one driving member. The driving member is movably coupled to the handle. In a pull configuration of the sliding mechanism, when the handle is rotated toward the bottom plate, the driving member is driven to drive the tray to move along a first direction, and when the handle is rotated away from the bottom plate, the tray is not driven to move. In a push configuration of the sliding mechanism, when the handle is rotated toward the bottom plate, the tray is not driven to move, and when the handle is rotated away from the bottom plate, the driving member is driven to drive the tray to move toward a second direction opposite to the first direction.

18 Claims, 7 Drawing Sheets

(56) References Cited

U.S. PATENT DOCUMENTS

| | | | | |
|---|---|---|---|---|
| 2012/0218705 A1* | 8/2012 | Huang | ................... | G06F 1/187 |
| | | | | 361/679.37 |
| 2012/0252238 A1* | 10/2012 | Zhang | ................. | H05K 7/1411 |
| | | | | 439/153 |
| 2014/0340837 A1* | 11/2014 | Jau | ........................... | G06F 1/16 |
| | | | | 361/679.33 |

* cited by examiner

MOUNTING DEVICE

FIELD

The subject matter herein generally relates to a mounting device for mounting an electronic module.

BACKGROUND

Electronic modules, such as circuit boards, generally have peripheral components, such as converters, to couple to external ports. Because of differences in port types, the converters need to be easily removable to couple to different port types. After the electronic module is fixed in a mounting device, the mounting device is slidably mounted to a rack. All-in-one type mounting devices are generally inconvenient for disassembling peripheral components, and modular type mounting devices generally have complex structures for disassembling peripheral components.

BRIEF DESCRIPTION OF THE DRAWINGS

Implementations of the present disclosure will now be described, by way of example only, with reference to the attached figures.

DETAILED DESCRIPTION

Figure 1:
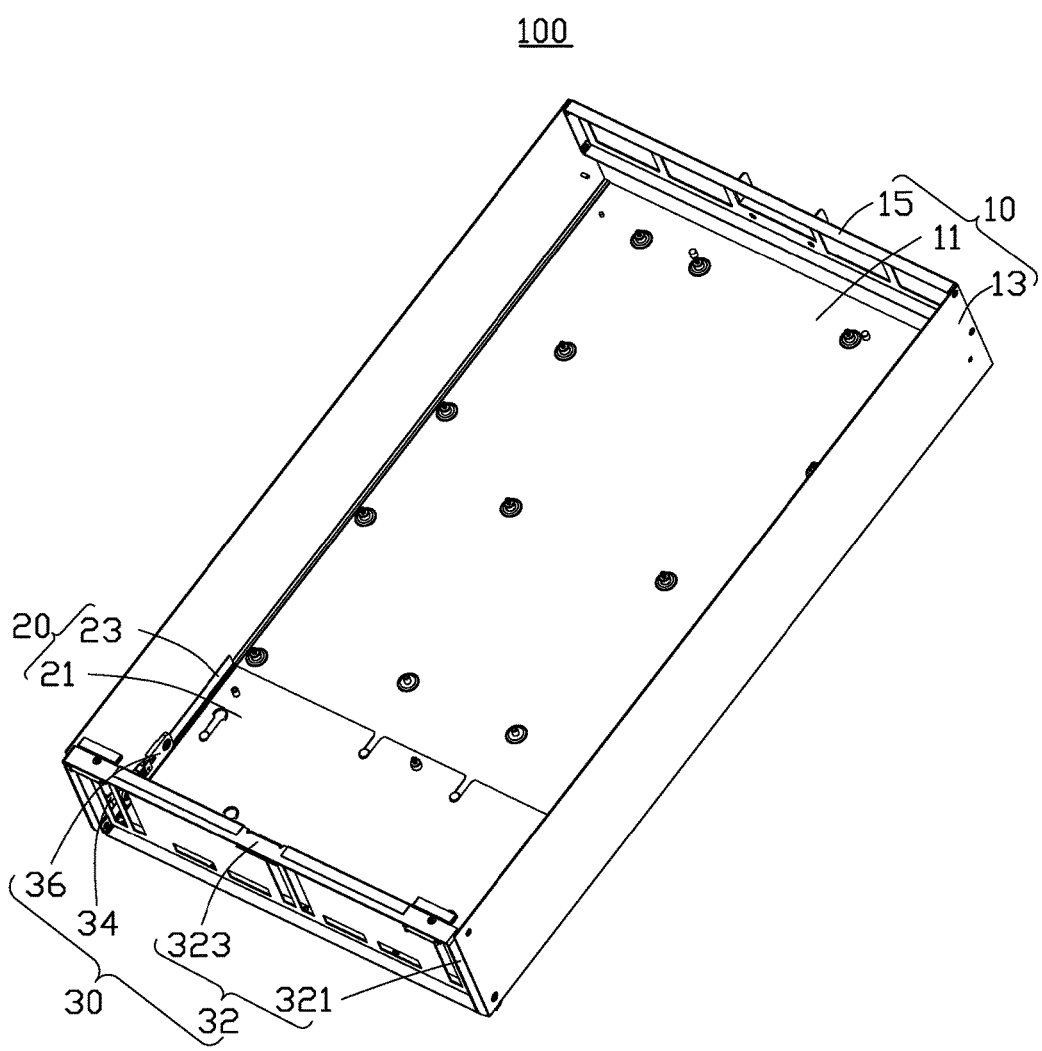
FIG. 1 is an assembled, isometric view of an embodiment of a mounting device.

It will be appreciated that for simplicity and clarity of illustration, where appropriate, reference numerals have been repeated among the different figures to indicate corresponding or analogous elements. Additionally, numerous specific details are set forth in order to provide a thorough understanding of the embodiments described herein. However, it will be understood by those of ordinary skill in the art that the embodiments described herein can be practiced without these specific details. In other instances, methods, procedures and components have not been described in detail so as not to obscure the related relevant feature being described. The drawings are not necessarily to scale and the proportions of certain parts may be exaggerated to better illustrate details and features. The description is not to be considered as limiting the scope of the embodiments described herein.

Several definitions that apply throughout this disclosure will now be presented.

The term "coupled" is defined as connected, whether directly or indirectly through intervening components, and is not necessarily limited to physical connections. The connection can be such that the objects are permanently connected or releasably connected. The term "substantially" is defined to be essentially conforming to the particular dimension, shape, or other word that "substantially" modifies, such that the component need not be exact. For example, "substantially cylindrical" means that the object resembles a cylinder, but can have one or more deviations from a true cylinder. The term "comprising" means "including, but not necessarily limited to"; it specifically indicates open-ended inclusion or membership in a so-described combination, group, series and the like.

Figure 2:
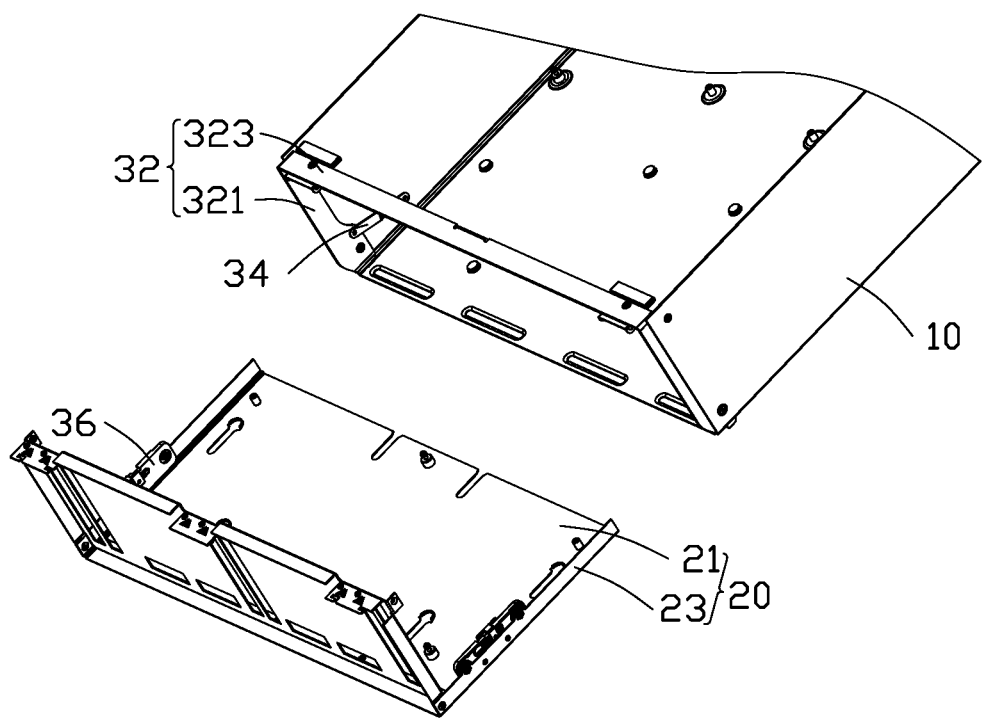
FIG. 2 is a partial exploded view of a mounting box and a tray of the mounting device in FIG. 1.

FIG. 1 and FIG. 2 show an embodiment of a mounting device 100. The mounting device 100 mounts an electronic module (not shown) therein. The mounting device 100 is slidably mounted within a chassis. The mounting device 100 includes a mounting box 10, a tray 20, and a sliding mechanism 30. The mounting box 10 mounts a main body of the electronic component. The tray 20 is slidably coupled to the mounting box 10. The tray 20 mounts peripheral components of the electronic component. The sliding mechanism 30 drives the mounting box 10 and the tray 20 to move simultaneously or drives the tray 20 to move individually.

The mounting box 10 includes a bottom plate 11 and two side plates 13. The two side plates 13 are oppositely arranged on two sides of the bottom plate 11. The bottom plate 11 and the two side plates 13 define a receiving space (not labeled) to receive the main body of the electronic component. In one embodiment, the mounting box 10 further includes a bracket 15. The bracket 15 is simultaneously coupled to an end of the bottom plate 11 and the two side plates 13. The bracket 15 may be used to mount a fan, for example. In other embodiment, the bracket 15 may be omitted. In other embodiment, the mounting box 10 may further include a top plate arranged opposite to the bottom plate, as long as the tray 20 is slidably mounted within the mounting box 10.

The tray 20 is slidably mounted to an end portion of the mounting box 10 away from the bracket 15. The tray 20 includes a sliding plate 21 and two fixing plates 23. The two fixing plates 23 are oppositely arranged on two sides of the sliding plate 21. The two fixing plates 23 are arranged parallel to the two side plates 13.

The sliding mechanism 30 includes a handle 32, two driving rods 34, two driving members 35, and two switching components 36. The handle 32 is rotationally mounted to the mounting box 10. Each of the two switching components 36 is mounted to a corresponding one of the two fixing plates 23. One end of each of the two driving rods 34 is rotationally coupled to the handle 32, and another end of each of the two driving rods 34 is coupled to a corresponding one of the two driving member 35. Each of the two driving members 35 resists against the corresponding switching component 36. The handle 32 is rotated downward to cause the two driving rods 34 to drive the driving member 35 to pull the switching component 36, and the handle 32 is rotated upward to cause the two driving rods 34 to drive the two driving members 35 to push the switching component 36. The switching component 36 may only be pushed or pulled by the driving member 35 to switch between a push configuration and a pull configuration.

The handle 32 includes a connecting rod 323 and two rotating rods 321. One of the rotating rods 321 is coupled to one end of the connecting rod 323, and another one of the rotating rods 321 is coupled to another end of the connecting rod 323. An end of each of the rotating rods 321 is rotationally coupled to an inner side of a corresponding one of the side plates 13.

Figure 4:
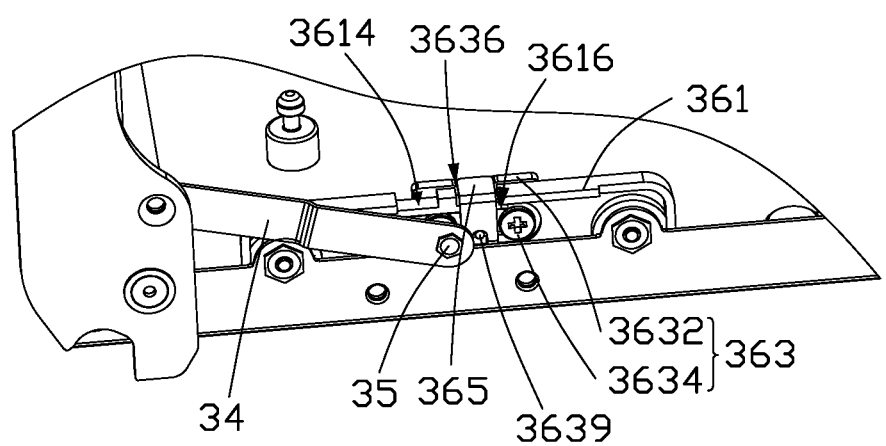
FIG. 4 shows the switching component in a push configuration.
Figure 5:
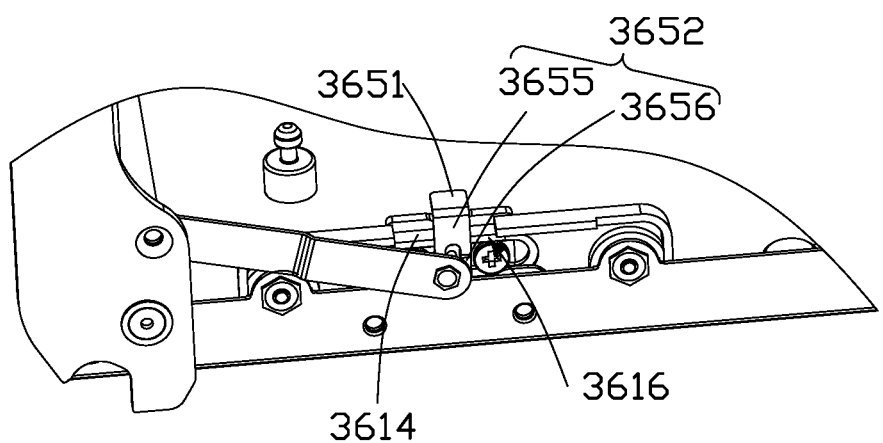
FIG. 5 shows the switching component switching between the push configuration and a pull configuration.

FIG. 2 and FIG. 4 show one end of each of the two driving rods 34 is rotationally coupled to a corresponding one of the rotating rods 321. Another end of each of the two driving rods 34 is coupled to a corresponding one of the two driving members 35. The driving member 35 is slidably mounted to the fixing plate 23. When the handle 32 is rotated, the driving rod 34 moves along with the handle 32 and drives the driving member 35 to move along the fixing plate 23 to push or pull the switching component 36. In one embodiment, the driving member 35 is a rolling pin. One end of the rolling pin is rotationally mounted to the driving rod 34, and another end of the rolling pin is rotationally mounted to a top portion of the fixing plate 23. In another embodiment, the driving member 35 may be in the form of another shape, as long as the driving member 35 is able to slide along the fixing plate 23.

Figure 3:
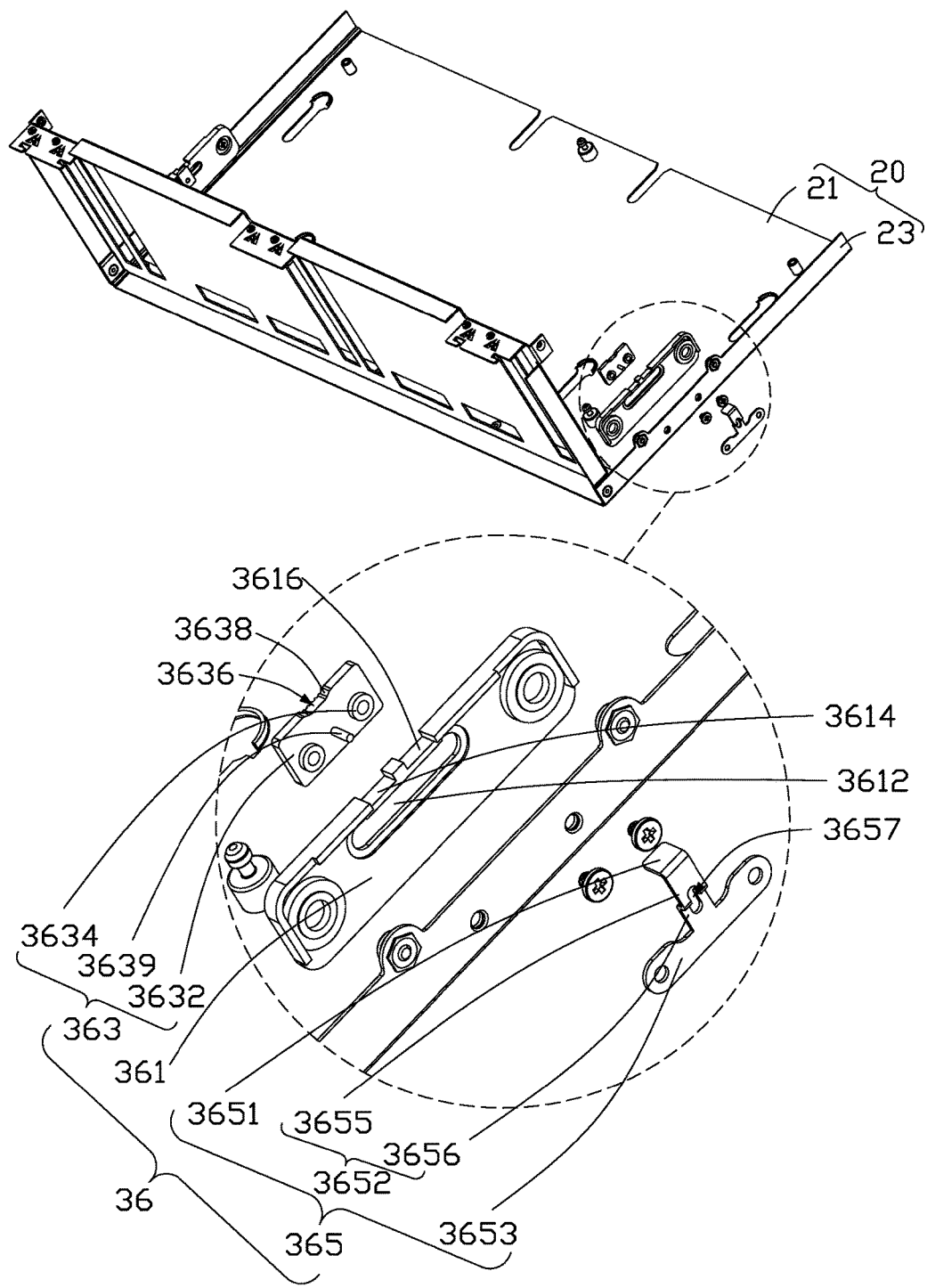
FIG. 3 is a partial exploded view of the tray and a switching component of the mounting device in FIG. 1.

FIG. 3 and FIG. 4 show each of the switching components 36 includes a mounting block 361, a pushing block 363, and a switching member 365. The mounting block 361 is mounted to an inner side of a corresponding one of the two fixing plates 23, and the mounting block 361 extends beyond an edge of the corresponding fixing plate 23. The mounting block 361 defines a sliding groove 3612, a first positioning slot 3614, and a second positioning slot 3616. The sliding groove 3612 is defined through opposite sides of the mounting block 361 and extends along a length of the mounting block 361. The first positioning slot 3614 and the second positioning slot 3616 are spaced apart and defined in an edge of the mounting block 361 away from the sliding plate 21. The first positioning slot 3614 and the second positioning slot 3616 are positioned on both sides of the driving member 35, such that the driving member 35 is positioned in between the first positioning slot 3614 and the second positioning slot 3616.

The pushing block 363 includes a main body 3632 and two fixing pins 3634. The two fixing pins 3634 are spaced apart and located on the main body 3632. The two fixing pins 3634 pass through the sliding groove 3612. The main body 3632 is located on an inner side of the mounting block 361 (away from the fixing plate 23). The main body 3632 slides along the sliding groove 3612 until the fixing pins 3634 are stopped by an inner wall of the sliding groove 3612. A top edge of the main body 3632 is substantially coplanar with a top edge of the mounting block 361. The top edge of the main body 3632 defines a driving slot 3636. The driving slot 3636 forms two sidewalls 3638 opposite to each other. The two sidewalls 3638 are inclined.

FIGS. 3-7 show the switching member 365 is mounted between the mounting block 361 and the fixing plate 23. The switching member 365 includes a first plate 3651, a second plate 3652, and a third plate 3653. Each of two ends of the third plate 3653 is rotationally coupled to an end portion of a coupling rod 3654 (shown in FIG. 7). Another end portion of each of the coupling rods 3654 is rotationally coupled to the fixing plate 23. One end of the second plate 3652 is coupled to a middle portion of the third plate 3653, and another end of the second plate 3652 extends away from the third plate 3653. The second plate 3652 includes a first connecting portion 3655 and a second connecting portion 3656. The second connecting portion 3656 is coupled to the third plate 3653. The first connecting portion 3655 is coupled to and forms a step junction with the second connecting portion 3656. The second connecting portion 3656 is positioned more adjacent to the mounting block 361 than to the first connecting portion 3655, and the first connecting portion 3655 is positioned further away from the mounting block 361 than the second connecting portion 3656. The first connecting portion 3655 is driven by the driving member 35. The second connecting portion 3656 passes between the driving member 35 and the mounting block 361.

The first plate 3651 and the second plate 3652 are coupled at an angle. The first plate 3651 is selectively received through either the first positioning slot 3614 or the second positioning slot 3616 and then correspondingly be received through the driving slot 3636.

The second plate 3652 defines an inserting slot 3657 extending substantially perpendicular to the sliding plate 21. The main body 3632 includes a pushing rod 3639 to be inserted through the inserting slot 3657.

Figure 6:
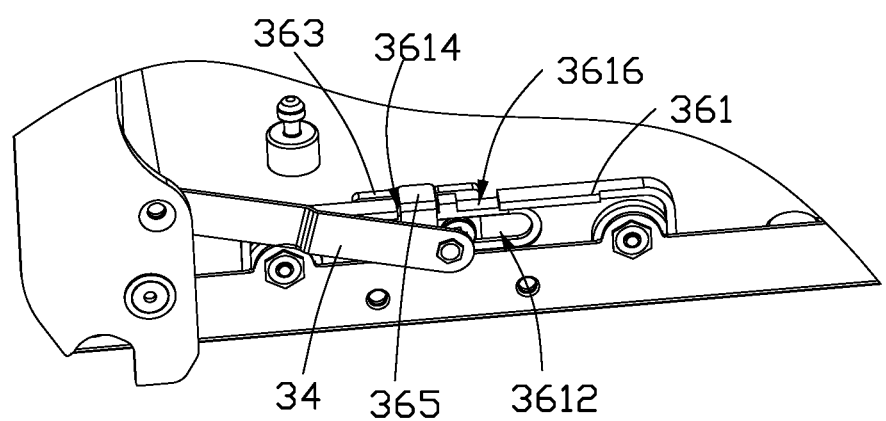
FIG. 6 shows the switching component in a pull configuration.
Figure 7:
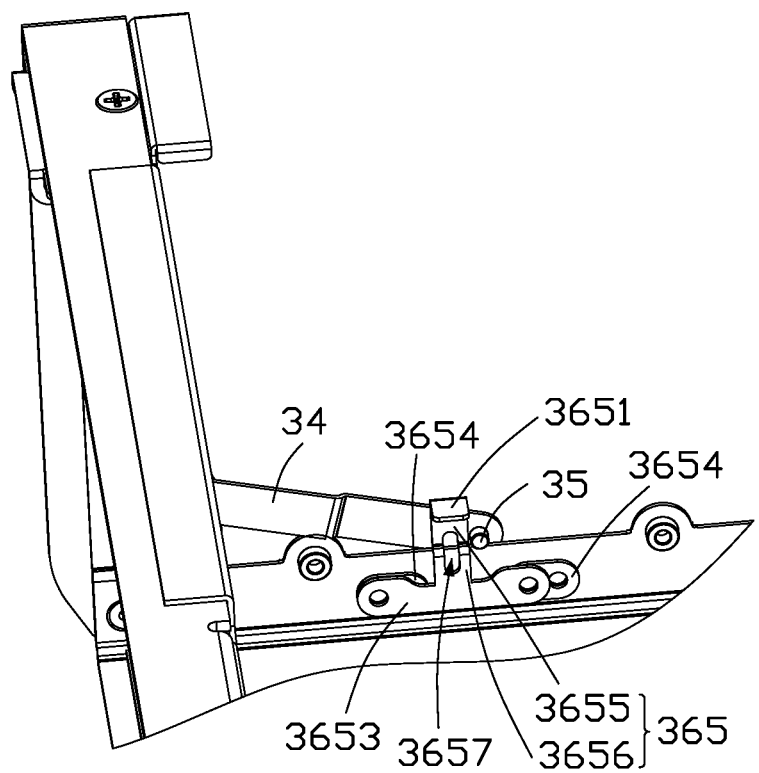
FIG. 7 shows a switching member and a driving rod.

FIGS. 3, 4, and 6 show that when the main body 3632 slides along the sliding groove 3612, the pushing rod 3639 pushes against the inner wall of the inserting slot 3657, and the fixing pins 3634 push the second plate 3652. Thus, the switching member 365 is pushed along a horizontal direction. When the switching member 365 is moved along the horizontal direction, the rotation of the two coupling rods 3654 and the inclination of the two sidewalls 3638 of the driving slot 3636 cause the switching member 365 to simultaneously move along a vertical direction away from the sliding plate 21. Thus, the first plate 3651 is removed from one of the first positioning slot 3614 or the second positioning slot 3616 and moved to a position above the mounting block 361, such that the first plate 3651 is removed from the driving member 35. Simultaneously, the second connecting portion 3656 is aligned with the driving member 35. As the main body 3632 continues to be moved, and the rotation of the two coupling rods 3654 further assists to cause the switching member 365 to move along the vertical direction toward the sliding plate 21 until the first plate 3651 is received in the other one of the first positioning slot 3614 or the second positioning slot 3616, and the first plate 3651 and the driving member 35 are located on a same horizontal line.

When the first plate 3651 is received in the first positioning slot 3614, the driving member 35 abuts one side of the second plate 3652. When the first plate 3651 is received in the second positioning slot 3616, the driving member 35 abuts the other side of the second plate 3652.

In detail, when the first plate 3651 is received in the first positioning slot 3614, the switching member 365 is in a pull configuration and is not able to be pushed. In the pull configuration, when the handle 32 is rotated toward the bottom plate 11, the driving rod 34 moves along with the handle 32, and the driving member 35 moves toward the first positioning slot 3614 and resists against the first connecting portion 3655. The first connecting portion 3655 drives the mounting block 361 and the tray 20 to move toward outside of the mounting box 10. When the handle 32 is rotated away from the bottom plate 11, the driving rod 34 moves along with the handle 32, and the driving member 35 moves toward the second positioning slot 3616. Because the first plate 3651 is received within the first positioning slot 3614, the driving member 35 is not able to resist against the first connecting portion 3655, and the tray 20 is not able to be moved. Thus, in the pull configuration, the handle 32 when rotated is only able to move the tray 20 toward outside of the mounting box 10, not toward inside the mounting box 10.

When the first plate 3651 is received within the second positioning slot 3616, the switching member 365 is in a push configuration and is not able to be pulled. In the push configuration, when the handle 32 is rotated toward the bottom plate 11, the driving rod 34 moves along with the handle 32, and the driving member 35 moves toward the first positioning slot 3614. Because the first plate 3651 is received within the second positioning slot 3616, the driving member 35 is not able to resist against the first connecting portion 3655, and the tray 20 is not able to be moved. When the handle 32 is rotated away from the bottom plate 11, the driving rod 34 moves along with the handle 32, the driving member 35 moves toward the second positioning slot 3616 and resists against the first connecting portion 3655, and the first connecting portion 3655 drives the mounting block 361 and the tray 20 to move toward inside the mounting box 10. Thus, in the push configuration, the handle 32 is able to push the tray 20 and is not able to pull the tray 20.

By directly pushing or pulling the handle 32, because the handle 32 is movably coupled to the mounting box 10, the tray 20 is able to be moved in or out of the mounting box 10.

In another embodiment, a quantity of the driving rod 34 and the switching component 36 may be one.

In another embodiment, the sliding groove 3612 and the fixing pins 3634 may be omitted, and the pushing block 363 may be slidably mounted to the mounting block 361 by another means, such as by a sliding rail, concave matching, or the like.

In another embodiment, the pushing block 363 may be omitted, such that the switching member 365 is directly moved between the first positioning slot 3614 and the second positioning slot 3616. When the pushing block 363 is omitted, the third plate 3653, the second connecting portion 3656, and the coupling rods 3654 may also be omitted.

In the mounting device 100 described above, one end of the driving rod 34 is rotationally coupled to the handle 32, and another end of the driving rod 34 is coupled to the driving member 35. The driving member 35 is driven by the handle 32 to drive the switching member 365 to move the tray 20. The switching member 365 is switched between the first positioning slot 3614 and the second positioning slot 3616 on either side of the driving member 35, such that the tray 20 can only be pushed or pulled at a time.

The embodiments shown and described above are only examples. Even though numerous characteristics and advantages of the present technology have been set forth in the foregoing description, together with details of the structure and function of the present disclosure, the disclosure is illustrative only, and changes may be made in the detail, including in matters of shape, size and arrangement of the parts within the principles of the present disclosure up to, and including, the full extent established by the broad general meaning of the terms used in the claims.

What is claimed is:

1. A mounting device comprising:
a mounting box comprising two oppositely arranged side plates;
a tray slidably mounted within the mounting box and comprising two oppositely arranged fixing plates; and
a sliding mechanism comprising:
a handle;
at least one driving rod;
at least one driving member; and
at least one switching component; wherein:
one end of the handle is rotationally mounted to one of the side plates, and another end of the handle is rotationally mounted to the other one of the side plates;
one end of the at least one driving rod is rotationally coupled to the handle, and another end of the at least one driving rod is coupled to the at least one driving member;
the at least one driving member is slidably mounted to the fixing plates;
the switching component comprises a mounting block and a switching member;

the mounting block is fixed to the fixing plates and protrudes beyond an edge of the fixing plates;
a portion of the mounting block protruding beyond the edge of the fixing plates defines a first positioning slot and a second positioning slot;
the switching member comprises a first plate and a second plate, the first plate and the second plate being connected together at an angle;
the first plate received through either the first positioning slot or the second positioning slot;
when the handle is rotated, the handle drives the at least one driving member to slide through the at least one driving rod, the at least one driving member resists against the second plate to drive the mounting block and the tray to move together;
when the first plate is received through the first positioning slot, the at least one driving member resists against a first side of the second plate and the at least one driving member drives the mounting block and the tray to move along a first direction; and
when the first plate is received through the second positioning slot, the at least one driving member resists against a second side opposite to the first side of the second plate and the at least one driving member drives the mounting block and the tray to move along a second direction opposite to the first direction.

2. The mounting device of claim 1, wherein:
the switching member further comprises a third plate;
the second plate comprises a first connecting portion and a second connecting portion, the second connecting portion is coupled to the first connecting portion;
the first connecting portion is coupled to the first plate, and the second connecting portion is coupled to the third plate;
the second connecting portion is more adjacent to the mounting block than the first connecting portion;
the first connecting portion is resisted by the at least one driving member;
the second connecting portion extends between the at least one driving member and the mounting block;
two ends of the third plate are each rotationally coupled to each of two coupling rods;
each of the two coupling rods is rotationally coupled to the fixing plate and the two coupling rods are parallel to each other;
the switching member is switched between the first positioning slot and the second positioning slot by the coupling rods;
when the switching member is switched between the first positioning slot and the second positioning slot, the switching member simultaneously moves along a direction perpendicular to the tray to align the second connecting portion with the at least one driving member to pass the second connecting portion between the at least one driving member and the mounting block.

3. The mounting device of claim 2, wherein:
the switching component further comprises a pushing block;
the pushing block comprises a main body slidably mounted to a side of the mounting block facing away from the fixing plate and a pushing rod;
a driving slot is defined in an edge of the pushing block away from the tray;
two sidewalls of the driving slot are formed at an angle;

the first plate received through either the first positioning slot or the second positioning slot is received through the driving slot;

the second plate defines an inserting slot extending perpendicular to the tray;

the pushing rod drives the switching member to move by pushing an inner wall of the inserting slot;

the coupling rods and the sidewalls drive the switching member to move away from the tray.

4. The mounting device of claim 3, wherein:

the pushing block further comprises two fixing pins spaced apart on the main body;

the mounting block defines a sliding groove extending parallel to the tray;

the fixing pins are slidably received within the sliding groove.

5. The mounting device of claim 1, wherein:

the at least one driving member is a roller pin;

one end of the rolling pin is rotationally mounted to the at least one driving rod;

and another end of the rolling pin is rotationally mounted to a top edge of the fixing plates.

6. The mounting device of claim 1, wherein:

the mounting box further comprises a bracket;

the bracket is coupled to an end of the two side plates away from the tray.

7. The mounting device of claim 1, wherein:

the handle comprises a connecting rod and two rotating rods, each of the rotating rods is coupled to a corresponding end of the connecting rod;

one end of each of the rotating rods is rotationally coupled to an inner side of the corresponding side plate away from the connecting rod.

8. The mounting device of claim 7, wherein:

a quantity of the at least one driving rod is two, and a quantity of the switching component is two;

each of the at least one driving rods is coupled to the corresponding rotating rod; and each of the switching components is mounted to the corresponding fixing plate.

9. A mounting device comprising:

a mounting box comprising a bottom plate; a tray slidably received within the mounting box; and a sliding mechanism comprising a handle and at least one driving member;

wherein:

the handle is rotationally coupled to the mounting box; the at least one driving member is movably coupled to the handle;

in a pull configuration of the sliding mechanism, the handle is rotated toward the bottom plate, the at least one driving member is driven to drive the tray to move along a first direction, and when the handle is rotated away from the bottom plate, the tray is not driven to move;

in a push configuration of the sliding mechanism, the handle is rotated toward the bottom plate, the tray is not driven to move, and when the handle is rotated away from the bottom plate, the at least one driving member is driven to drive the tray to move toward a second direction opposite to the first direction;

wherein:

the mounting box comprises two oppositely arranged side plates;

the tray comprises two oppositely arranged fixing plates;

the sliding mechanism further comprises at least one driving rod and at least one switching component;

one end of the handle is rotationally mounted to one of the side plates, and another end of the handle is rotationally mounted to the other one of the side plates;

one end of the at least one driving rod is rotationally coupled to the handle, and another end of the at least one driving rod is coupled to the driving member;

the at least one driving member is slidably mounted to the fixing plates;

the switching component comprises a mounting block and a switching member;

the mounting block is fixed to the fixing plates and protrudes beyond an edge of the fixing plate;

a portion of the mounting block protruding beyond the edge of the fixing plate defines a first positioning slot and a second positioning slot;

the switching member comprises a first plate and a second plate, the first plate and the second plate being connected together at an angle;

the first plate is configured to be received through either the first positioning slot or the second positioning slot.

10. The mounting device of claim 9, wherein:

the switching member comprises a first plate and a second plate, the first plate and the second plate being connected together at an angle;

the first plate is configured to be received through either the first positioning slot or the second positioning slot;

when the handle is rotated, the at least one driving rod drives the driving member to slide, the at least one driving member resists against the second plate to drive the mounting block and the tray to move together;

when the first plate is received through the first positioning slot, the at least one driving member drives the mounting block and the tray to move along the first direction; and when the first plate is received through the second positioning slot, the at least one driving member drives the mounting block and the tray to move along the second direction opposite to the first direction.

11. The mounting device of claim 10, wherein:

the first direction is toward outside the mounting box; and the second direction is toward inside the mounting box.

12. The mounting device of claim 11, wherein:

the switching member further comprises a third plate;

the second plate comprises a first connecting portion and a second connecting portion, the second connecting portion being coupled to the first connecting portion;

the first connecting portion is coupled to the first plate, and the second connecting portion is coupled to the third plate;

the second connecting portion is more adjacent to the mounting block than to the first connecting portion;

the first connecting portion is resisted by the at least one driving member;

the second connecting portion extends between the at least one driving member and the mounting block;

two ends of the third plate are each rotationally coupled to each of two coupling rods;

each of the two coupling rods is rotationally coupled to the fixing plate;

the switching member is switched between the first positioning slot and the second positioning slot by the coupling rods;

when the switching member is switched between the first positioning slot and the second positioning slot, the switching member simultaneously moves along a direction perpendicular to the tray to align the second connecting portion with the at least one driving member to pass the second connecting portion between the at least one driving member and the mounting block.

13. The mounting device of claim 12, wherein:
the switching component further comprises a pushing block;
the pushing block comprises a main body slidably mounted to a side of the mounting block facing away from the fixing plate;
a driving slot is defined in an edge of the pushing block away from the tray;
two sidewalls of the driving slot are formed at an angle;
the first plate received through either the first positioning slot or the second positioning slot is received through the driving slot;
the main body comprises a pushing rod;
the second plate defines an inserting slot extending perpendicular to the tray;
the pushing rod drives the switching member to move by pushing an inner wall of the inserting slot;
the coupling rods and the sidewalls drive the switching member to move away from the tray.

14. The mounting device of claim 13, wherein:
the pushing block further comprises two fixing pins spaced apart on the main body;
the mounting block defines a sliding groove extending parallel to the tray;
the fixing pins are slidably received within the sliding groove; and
the pushing block slides along the sliding groove.

15. The mounting device of claim 14, wherein:
the at least one driving member is a roller pin;
one end of the rolling pin is rotationally mounted to the at least one driving rod; and another end of the rolling pin is rotationally mounted to a top edge of the fixing plates.

16. The mounting device of claim 14, wherein:
the mounting box further comprises a bracket;
the bracket is coupled to an end of the two side plates away from the tray.

17. The mounting device of claim 14, wherein:
the handle comprises a connecting rod and two rotating rods, each of the rotating rods is coupled to a corresponding end of the connecting rod;
one end of each of the rotating rods is rotationally coupled to an inner side of the corresponding side plate away from the connecting rod.

18. The mounting device of claim 17, wherein:
a quantity of the at least one driving rod is two, and a quantity of the switching component is two; each of the at least one driving rods is coupled to the corresponding rotating rod;
and each of the switching components is mounted to the corresponding fixing plate.

\* \* \* \* \*